(12) United States Patent
Chae et al.

(10) Patent No.: US 9,853,438 B2
(45) Date of Patent: Dec. 26, 2017

(54) POWER CABLE HAVING END CONNECTING PORTION

(71) Applicant: LS CABLE & SYSTEM LTD, Anyang-si, Gyeonggi-do (KR)

(72) Inventors: Byung Ha Chae, Gumi-si (KR); Sung Yun Kim, Daegu (KR); Tae Ho Lee, Gumi-si (KR); Seung Myung Choi, Gumi-si (KR); Eui Hwan Jung, Chungcheongbuk-do (KR)

(73) Assignee: LS CABLE & SYSTEMS LTD., Anyang-si, Gyeonggi-do (KR)

( * ) Notice: Subject to any disclaimer, the term of this patent is extended or adjusted under 35 U.S.C. 154(b) by 0 days.

(21) Appl. No.: 15/121,574

(22) PCT Filed: Jul. 24, 2014

(86) PCT No.: PCT/KR2014/006738
§ 371 (c)(1),
(2) Date: Aug. 25, 2016

(87) PCT Pub. No.: WO2015/129968
PCT Pub. Date: Sep. 3, 2015

(65) Prior Publication Data
US 2017/0222422 A1    Aug. 3, 2017

(30) Foreign Application Priority Data

Feb. 25, 2014 (KR) .................. 10-2014-0022014
Jul. 17, 2014 (KR) .................. 10-2014-0090293

(51) Int. Cl.
*H02G 15/068* (2006.01)
*H01B 3/52* (2006.01)
(Continued)

(52) U.S. Cl.
CPC ............ *H02G 15/068* (2013.01); *H01B 3/52* (2013.01); *H01B 9/027* (2013.01); *H05K 9/0098* (2013.01)

(58) Field of Classification Search
CPC ..... H02G 15/068; H01B 9/027; H05K 9/0098
See application file for complete search history.

(56) References Cited

U.S. PATENT DOCUMENTS 3,773,965 A * 11/1973 Reynolds ............. H01B 7/0233
                                                                174/102 SC
3,875,327 A    4/1975 Hildenbrand
(Continued)

FOREIGN PATENT DOCUMENTS

JP    06-153372 A    5/1994
JP    08-161944 A    6/1996
(Continued)

OTHER PUBLICATIONS

International Search Report for PCT/KR2014/006738 dated Nov. 5, 2014 from Korean Intellectual Property Office.
(Continued)

*Primary Examiner* — Hoa C Nguyen
*Assistant Examiner* — Amol Patel
(74) *Attorney, Agent, or Firm* — Paratus Law Group, PLLC

(57) ABSTRACT

A power cable with a termination connection box. The power cable includes a conductor, an inner semiconducting layer, an insulating layer, and an outer semiconducting layer which are sequentially formed. The termination connection box includes: a porcelain tube configured to provide an inner space into which an end portion of the power cable from which portions of the outer semiconducting layer, the insulating layer, and the inner semiconducting layer are sequentially removed is inserted; and a reinforcing insulating layer
(Continued)

configured to cover an outer side of the insulating layer of the power cable so as to reinforce dielectric strength of a portion of the power cable from which the portion of the outer semiconducting layer is removed and at which an electric field is thus concentrated.

11 Claims, 3 Drawing Sheets

(51) Int. Cl.
*H05K 9/00* (2006.01)
*H01B 9/02* (2006.01)

(56) References Cited

U.S. PATENT DOCUMENTS

| | | | | |
|---|---|---|---|---|
| 6,207,261 | B1* | 3/2001 | Kuwabara | H01B 3/54 174/110 PM |
| 9,306,382 | B2* | 4/2016 | Ladie | H02G 15/24 |
| 2010/0206616 | A1 | 8/2010 | Motoi et al. | |
| 2012/0285725 | A1* | 11/2012 | Maritano | H01B 3/52 174/120 FP |
| 2016/0049218 | A1* | 2/2016 | Liu | H01B 9/0688 428/377 |

FOREIGN PATENT DOCUMENTS

| | | |
|---|---|---|
| JP | 08-223770 A | 8/1996 |
| JP | 08-223771 A | 8/1996 |
| JP | 09-093780 A | 4/1997 |
| JP | 10-243542 A | 9/1998 |
| JP | 2000-276954 A | 10/2000 |
| JP | 2002-245867 A | 8/2002 |
| JP | 2005-117802 A | 4/2005 |
| JP | 2013-005500 A | 1/2013 |
| KR | 10-2010-0046225 A | 5/2010 |
| KR | 10-2010-0091678 A | 8/2010 |
| WO | WO 2012/116712 A1 | 9/2012 |

OTHER PUBLICATIONS

European Search Report for EP Application No. 14 883 594.5 dated Sep. 29, 2017 from European Patent Office.

* cited by examiner

POWER CABLE HAVING END CONNECTING PORTION

CROSS REFERENCE TO PRIOR APPLICATIONS

This application is a National Stage Patent Application of PCT International Patent Application No. PCT/KR2014/006738 (filed on Jul. 24, 2014) under 35 U.S.C. §371, which claims priority to Korean Patent Application Nos. 10-2014-0022014 (filed on Feb. 25, 2014) and 10-2014-0090293 (filed on Jul. 17, 2014), which are all hereby incorporated by reference in their entirety.

BACKGROUND

1. Field

The present invention relates to a power cable with a termination connection box, and more particularly, to a power cable with a termination connection box, in which the occurrence of heterojunction interfaces is reduced to prevent accumulation of space charges so as to mitigate an electric field when the power cable is coupled to the termination connection box, and which can be reduced in size by reducing the size of the termination connection box.

2. Description of the Related Art

In general, a power cable is installed under the ground, on the ground, or at the bottom of a sea to supply power to a desired location using a conductor which supplies power. In the power cable, it is very important to insulate the conductor. To this end, an insulating layer for insulating the conductor is formed of cross-linked polyethylene (XLPE) or the like or is formed by winding insulating paper or the like.

A so-called 'paper insulation cable' including an insulating layer formed by winding the insulating paper may be classified as an oil-filled (OF) cable or a mass-impregnated (MI) cable according to the viscosity of insulating oil used. In the OF cable, the insulating paper is impregnated with relatively low-viscosity insulating oil. In contrast, in the MI cable, the insulating paper is impregnated with relatively high-viscosity insulating oil. In the OF cable, the insulating paper is impregnated with the relatively low-viscosity insulating oil to cause the insulating oil to flow within the cable. In the MI cable, the relatively high-viscosity insulating oil is used and thus hardly flows in the insulating paper.

When the temperature of the MI cable increases to a predetermined temperature or more, the insulating oil may flow to the outside of the insulating layer. However, even if the temperature of the MI cable decreases, the insulating oil does not return to the original position thereof and thus a portion of the insulating layer from which the insulating oil escapes becomes a void. The dielectric strength of the insulating layer may be degraded due to the void. In order to solve this problem, Japanese Patent Application No. 1994-306654 (hereinafter referred to as 'Document 1') employs composite insulating paper formed of plastic and kraft paper when an insulating layer is formed of insulating paper impregnated with high-viscosity insulating oil. Document 1 discloses a three-layer structure in which kraft paper is stacked on the top and bottom of a plastic layer. In Document 1, voids caused by escape of the insulating oil are reduced by suppressing movement of the insulating oil due to thermal expansion of the plastic layer, thereby preventing dielectric breakdown from occurring.

Joint boxes are coupled to the power cable at intervals of several hundreds of meters or several tens of kilometers, and a termination connection box is coupled to an end of the power cable. The termination connection box may be classified as an air-termination connection box, a gas-termination connection box, or an oil-termination connection box according to a state in which an exposed end portion of a conductor of the cable is connected. However, an insulating layer of the power cable is exposed inside the joint boxes or the termination connection box. In this case, when the insulating layer is formed of a plurality of types of materials as in Document 1, a plurality of heterojunction interfaces may be generated when the power cable is coupled to the joint boxes or the termination connection box. When the plurality of heterojunction interfaces are generated, space charges may be accumulated and thus an electric field may be concentrated.

WO 2012-116712 (hereinafter referred to as 'Document 2') discloses a method of joining high-voltage paper insulation cables. Document 2 discloses a method of exposing conductors included in the cables by removing protective layers and outer semiconducting layers, cutting insulating layers in a direction substantially perpendicular to a lengthwise direction thereof, and removing inner semiconducting layers, and then coupling the conductors to each other, and a method of forming the inner semiconducting layer, the insulating layer, and the outer semiconducting layer. However, Document 2 relates to joining of the paper insulation cables but does not particularly describe materials of the insulating layer and a reinforcing insulating layer. Thus, problems caused by heterojunction interfaces as described above and a structure for preventing the occurrence of heterojunction interfaces are not suggested in Document 2.

Japanese Patent Application No. 1992-317947 (hereinafter referred to as 'Document 3') discloses a joint box for a paper insulation cable, in which when a reinforcing insulating layer is provided, the reinforcing insulating layer is formed of the same insulating paper as an insulating layer of the cable or is formed of insulating paper having lower permittivity than that of the insulating layer of the cable. However, Document 3 simply discloses a structure in which the insulating paper having lower permittivity than that of the insulating layer of the cable is provided such that high voltage is applied to the insulating paper to decrease electric stress.

Various examples of a termination connection box for the paper insulation cable are disclosed in Japanese Patent Application No. 1995-242989 (hereinafter referred to as 'Document 4'), Japanese Patent Application No. 1997-041178 (hereinafter referred to as 'Document 5'), Japanese Patent Application No. 1995-022086 (hereinafter referred to as 'Document 6'), and Japanese Patent Application No. 1995-022085 (hereinafter referred to as 'Document 7').

Document 4 simply discloses a termination structure for a MI cable, in which an insulating layer is formed of a compound such as magnesium oxide (MgO).

Document 5 discloses a termination structure for a MI cable, in which a reinforcing insulating layer and an electric-field mitigation cone are formed by covering an exposed end portion of the cable with a plurality of pieces of paper having different thicknesses.

Documents 6 and 7 disclose termination connection boxes for a MI cable, in which a clearance is formed between a cable core and a condenser core, through which insulating oil flows.

Accordingly, although Documents 4 to 7 disclose termination connection boxes for the MI cable but do not suggest problems caused by heterojunction interfaces between the cable and the termination connection boxes and a structure preventing the heterojunction interfaces from being formed.

SUMMARY

The technical purpose of the present invention is to provide a power cable with a termination connection box, in which the occurrence of heterojunction interfaces between the power cable and the termination connection box are reduced to prevent accumulation of space charges and an electric field may be mitigated.

Furthermore, the technical purpose of the present invention is to provide a power cable with a termination connection box, in which when the power cable and the termination connection box are coupled to each other, the whole system may be reduced in size by reducing the size of the termination connection box.

According to an aspect of example embodiment, there is provided a power cable with a termination connection box, the power cable comprising a conductor, an inner semiconducting layer, an insulating layer, and an outer semiconducting layer which are sequentially formed, wherein the insulating layer comprises composite insulating paper, wherein surfaces of the insulating layer which are in contact with the inner semiconducting layer and the outer semiconducting layer are wound with insulating paper including only kraft paper, and the composite insulating paper has a structure in which the kraft paper is stacked on top and bottom surfaces of thermoplastic resin, and wherein the termination connection box comprises a porcelain tube configured to provide an inner space into which an end portion of the power cable from which portions of the outer semiconducting layer, the insulating layer, and the inner semiconducting layer are sequentially removed is inserted; and a reinforcing insulating layer configured to cover an outer side of the insulating layer of the power cable so as to reinforce dielectric strength of a portion of the power cable from which the portion of the outer semiconducting layer is removed and at which an electric field is thus concentrated, wherein the reinforcing insulating layer comprises the same insulating paper as an outermost layer of the insulating layer of the power cable.

The reinforcing insulating layer comprises the kraft paper.

An electric-field mitigation cone configured to mitigate concentration of an electric field, and a shielding layer are provided in the porcelain tube.

The reinforcing insulating layer supports the electric-field mitigation cone.

The reinforcing insulating layer comprises an upper inclined portion having a predetermined slope toward an end portion of the termination connection box from which the conductor is pushed out, wherein the upper inclined portion corresponds to an upper portion of the termination connection box.

The termination connection box further comprises a core provided on the exposed insulating layer of the power cable and corresponding to the upper inclined portion of the reinforcing insulating layer, wherein the electric-field mitigation cone is formed by winding a plurality of pieces of insulating paper around the core.

The core comprises a first base portion provided on an outer circumference of the insulating layer of the power cable, a second base portion which is in closely contact with an outer circumference of the reinforcing insulating layer; and an inclined portion connecting the first base portion and the second base portion to each other, wherein the inclined portion corresponds to the upper inclined portion of the reinforcing insulating layer.

The plurality of pieces of insulating paper of the electric-field mitigation cone comprise a structure in which kraft paper is stacked on top and bottom surfaces of thermoplastic resin.

The shielding layer is electrically connected to the outer semiconducting layer of the power cable inserted into the porcelain tube.

The reinforcing insulating layer comprises a lower inclined portion having a predetermined slope in a direction in which the power cable is inserted, wherein the lower inclined portion corresponds to a lower portion of the termination connection box.

The shielding layer is provided along the lower inclined portion of the reinforcing insulating layer, such that the shielding layer tilts at a predetermined angle with respect to an outer surface of the insulating layer of the power cable exposed in a direction of the end portion of the termination connection box from which the conductor is pushed out and extends to the reinforcing insulating layer and at least a portion of the electric-field mitigation cone.

DETAILED DESCRIPTION

Figure 1:
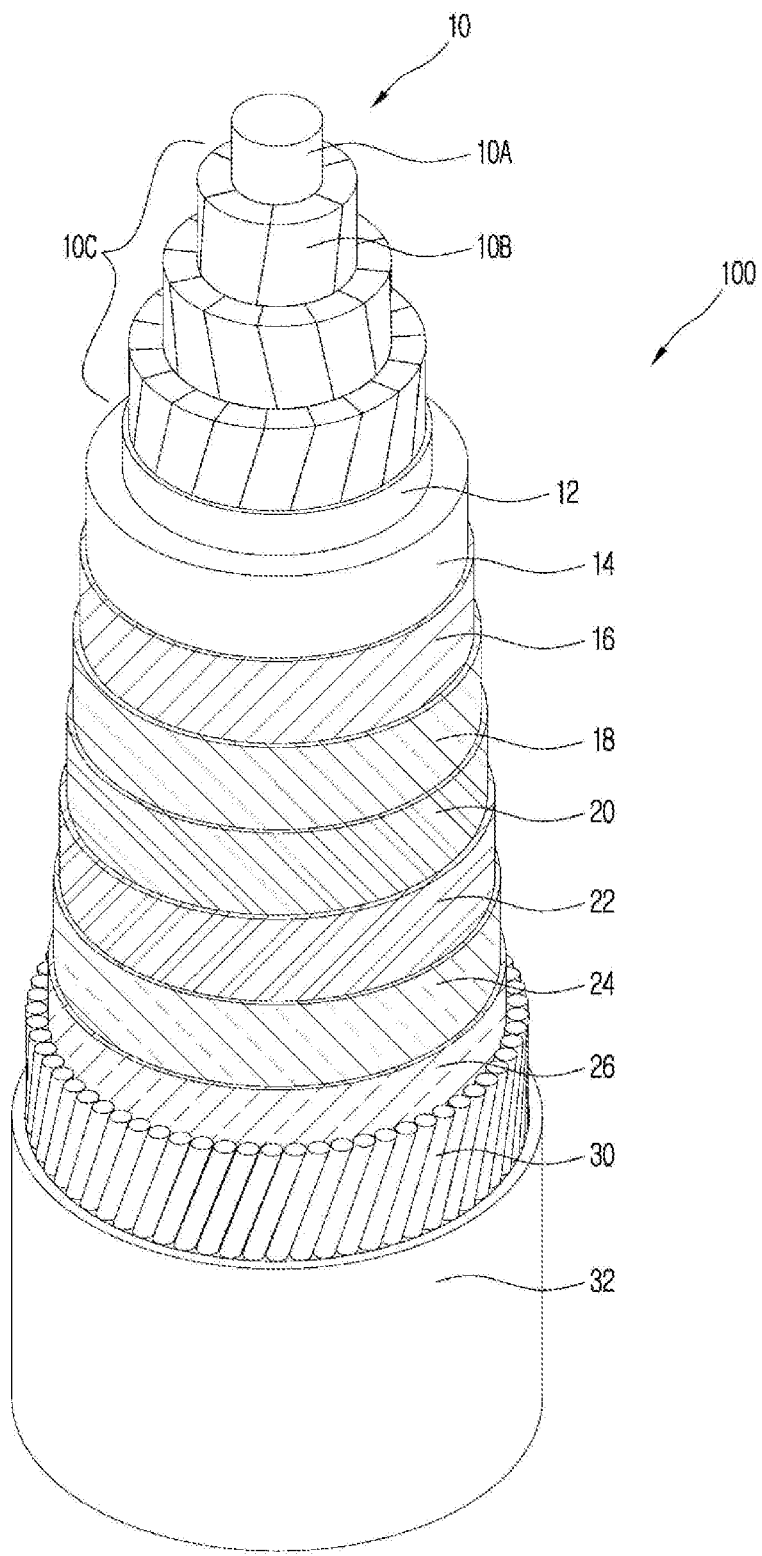
FIG. 1 is a partially exploded perspective view illustrating a structure of a paper insulation cable according to an embodiment of the present invention.

Hereinafter, various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The same reference numerals represent the same elements throughout the drawings.

In general, joint boxes are coupled to a paper insulation power cable at intervals of several hundreds of meters to several tens of kilometers and a termination connection box is coupled to an end of this power cable. The termination connection box may be classified as an air-termination connection box, a gas-termination connection box, or an oil-termination connection box. The air-termination connection box is mainly used to connect an underground cable and an aerial cable in an outdoor substation or the like. A structure of the paper insulation power cable will be first described and then a structure of the termination connection box will described below.

FIG. 1 is a partially exploded perspective view illustrating a structure of a paper insulation power cable 100 (hereinafter referred to as the cable 100) according to an embodiment of the present invention.

Referring to FIG. 1, the cable 100 includes a conductor 10 at a center thereof. The conductor 10 acts as a path through which current flows. As illustrated in FIG. 1, the conductor 10 may include a flat element wire layer 10C including a central element wire 10A having a round shape and flat element wires 10B twisted together to cover the central element wire 10A. The flat element wire layer 10C is manufactured by forming the flat element wires 10B to have tetragonal cross-sections according to a continuous extrusion process and twisting the flat element wires 10B together on the central element wire 10A. The conductor 10 is formed in a round shape. Although not shown, the conductor 10 may be formed by twisting a plurality of round element wires together. However, a conductor formed of flat element wires has a higher space factor than that of a conductor formed of round element wires and may be thus appropriate for a high-voltage power cable.

However, since the conductor 10 has a non-smooth surface, an electric field thereon may be not uniform or a corona discharge is likely to occur locally therein. Furthermore, when a void occurs between the surface of the conductor 10 and an insulating layer 14 which will be described below, the insulation performance of the cable 100 may be degraded. To solve this problem, an external surface of the conductor 10 may be covered with a semiconducting material such as semiconducting carbon paper. Here, a layer formed of the semiconducting material will be defined as an inner semiconducting layer 12.

Thus, the inner semiconducting layer 12 mitigates an electric field on a surface of the conductor 10 and prevents a partial discharge from occurring due to a void between the conductor 10 and the insulating layer 14. The inner semiconducting layer 12 may also make the cable 100 have a form of an ideal concentrically cylindrical electrode to planarize the surface of the conductor 10, thereby mitigating the concentration of an electric field, and make the conductor 10 and the insulating layer 14 to be in close contact each other, thereby preventing a corona discharge from occurring on a surface of the conductor 10. Furthermore, electrons may be prevented from being injected or flowing between the conductor 10 and the inner semiconducting layer 12 and between the inner semiconducting layer 12 and the insulating layer 14, thereby adsorbing impurities.

The insulating layer 14 is provided on an outer side of the inner semiconducting layer 12. The insulating layer 14 electrically insulates the conductor 10 from the outside. In general, a high breakdown voltage of the insulating layer 14 should be high and the insulation performance thereof should be stably maintained for a long time. Furthermore, the insulating layer 14 should have a low dielectric loss and thermal-resistance performance such as a heat-resisting property. In the present embodiment, the insulating layer 14 is formed according to a paper insulation process of winding insulating paper around a surface of the inner semiconducting layer 12. Furthermore, in order to improve an insulating property of the cable 100, the conductor 10, the surface of which is wound with the insulating paper is impregnated with insulating oil. The insulating oil is absorbed into the insulating paper through this impregnation process. The cable 100 may be classified as an oil-filled (OF) cable or a mass-impregnated (MI) cable according to the viscosity of the insulating oil.

The insulating paper is impregnated with relatively low-viscosity insulating oil in the OF cable, whereas the insulating paper is impregnated with relatively high-viscosity insulating oil in the MI cable. In the OF cable, the insulating paper is impregnated with the relatively low-viscosity insulating oil to cause the insulating oil to flow within the cable. In the MI cable, the relatively high viscosity insulating oil is used and thus hardly flows in the insulating paper.

For example, if the cable 100 is the OF cable, when the cable 100 is used at the bottom of a sea, the cable 100 requires elements for causing insulating oil to flow at predetermined intervals of distance and is thus not appropriate to be used at the bottom of the sea. Thus, in order to use the cable 100 at the bottom of the sea, the cable 100 may be the MI cable in which the flow of the insulating oil is limited may be appropriate. Hereinafter, in the present embodiment, the MI cable which is available at the bottom of a sea and which is manufactured by impregnating insulating paper with relatively high-viscosity insulating oil or an insulating compound will be described below.

Figure 3:
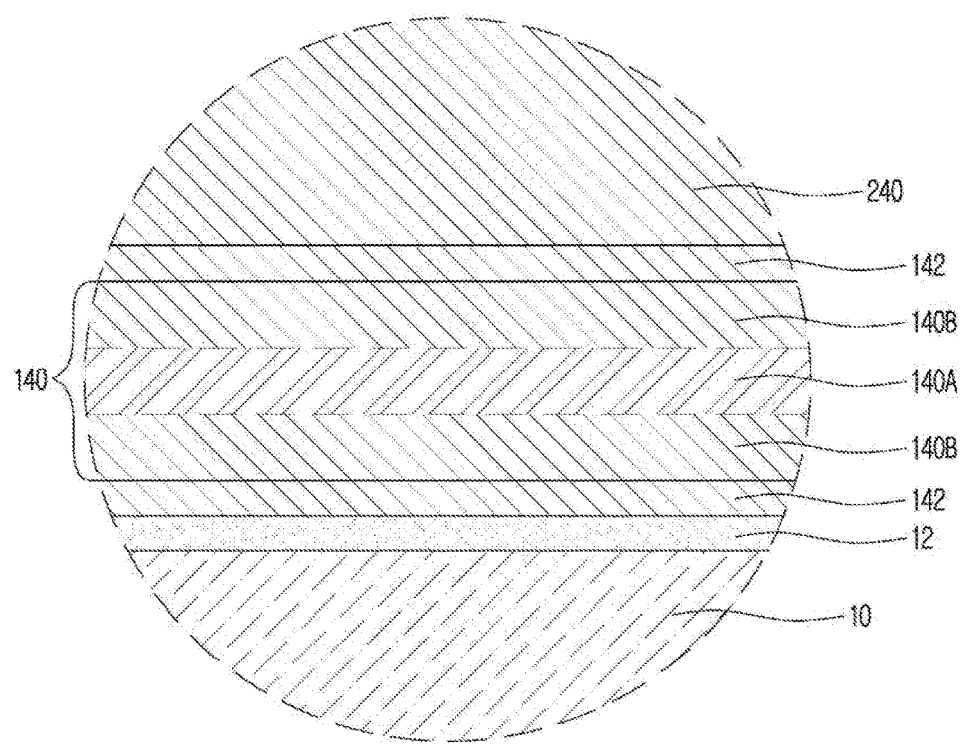
FIG. 3 is a partially expanded cross-sectional view illustrating a case in which an outermost layer of an insulating layer of a cable and a reinforcing insulating layer are formed of the same material.

In the present embodiment, the insulating layer 14 is formed by winding a plurality of pieces of insulating paper, for example, by repeatedly winding kraft paper 142 (see FIG. 3) and composite insulating paper 140 (see FIG. 3). In detail, the insulating layer 14 may be formed by winding a plurality of times the composite insulating paper 140, for example, having a structure in which kraft paper 140B is stacked at the top and bottom of polypropylene resin 140A, such that a surface of the insulating layer 14 which is in contact with the inner semiconducting layer 12 and a surface thereof which is in contact with an outer semiconducting layer 16 may be formed by winding the kraft paper 142.

In the case of the MI cable formed by winding kraft paper around an entire insulating layer and impregnating the insulating layer with insulating oil, a temperature difference occurs inside a radial direction (i.e., outside a radial direction of a portion of the insulating layer in a direction of an inner semiconducting layer, i.e., on a portion of the insulating layer in a direction of an outer semiconducting layer to be described below) due to current flowing through a conductor of the MI cable when this cable is operated. Thus, the insulating oil of the portion of the insulating layer (which is at a higher temperature) in the direction of the inner semiconducting layer becomes low in viscosity and thermally expands to move outside the radial direction. When the temperature of the portion of the insulating layer deceases, the insulating oil moving due to the thermal expansion thereof increases in viscosity but does not return to the original state thereof. Thus, bubbles occur inside the radial direction, i.e., at the portion of the insulating layer in the direction of the inner semiconducting layer, thereby degrading the insulation performance of the MI cable.

However, if the insulating layer 14 is formed of composite insulating paper as described above, when the cable 100 is operated, thermoplastic resin, such as polypropylene resin, which is not impregnated with the insulating oil may thermally expand and thus suppress the flow of the insulating oil. More electric fields may be assigned to the polypropylene resin having higher resistivity and higher dielectric strength than those of kraft paper according to resistive electric field distribution characteristics of a direct-current (DC) cable in which an electric field is distributed according to resistivity. Electric fields assigned to bubbles occurring as the insulating oil shrinks or expands due to a change in temperature when the cable is operated/short-circuited may be mitigated.

Furthermore, since polypropylene resin is not impregnated with the insulating oil, the insulating oil may be suppressed from flowing in a direction of the diameter of the cable 100 due to the force of gravity. In addition, the flow of the insulating oil may be more suppressed, since polypropylene resin thermally expands according to impregnation temperature during the manufacture of the cable 100 or working temperature of the cable 100 when the cable 100 is operated and thus applies surface pressure to the kraft paper.

Furthermore, since kraft paper having lower resistivity than that of composite insulating paper is provided on a surface of the insulating layer 14 which is in contact with the inner semiconducting layer 12 and a surface thereof which is in contact with the outer semiconducting layer 16, an electric field may be mitigated by the kraft paper layer to prevent degradation of impulse breakdown characteristics even when bubbles occur at an impulse breakdown point, e.g., an interface between the insulating layer 14 and the inner semiconducting layer 12 or an interface between the insulating layer 14 and the outer semiconducting layer 16. Furthermore, the kraft paper hardly has a polar effect with respect to impulse breakdown and may thus decrease impulses caused by the polar effect when plastic laminated paper is used.

Furthermore, more electric fields may be distributed on the composite insulating paper having higher resistivity than that of the kraft paper according to resistive electric field distribution characteristics of a DC cable in which an electric field is distributed according to resistivity. Accordingly, since the intensity of the electric field on the kraft paper may be lower than that on the composite insulating paper, the kraft paper may have relatively high temperature and thus the insulating oil may relatively actively shrink or expand when the cable 100 is operated, thereby increasing a possibility of generating bubbles. Furthermore, the insulating layer 14 is formed by winding the kraft paper on a portion of a section right above the conductor 10 having a high-intensity electric field, i.e., an interface between the inner semiconducting layer and the insulating layer 14 and/or an outer portion of the insulating layer 14 at which the intensity of an electric field increases due to reversal of the electric field as temperature increases when the cable 100 is operated, i.e., an interface between the outer semiconducting layer 16 and the insulating layer 14, thereby stabilizing the insulation performance of the insulating layer 14.

The composite insulating paper may have a structure in which kraft paper is stacked on one surface of thermoplastic resin such as polypropylene resin, a structure in which thermoplastic resin such as polypropylene resin is stacked on top and bottom surfaces of kraft paper, a structure in which kraft paper and thermoplastic resin such as polypropylene resin are alternately stacked in four layers or more, or the like. In this case, an operation and effect of the composite insulating paper are the same as those of the insulating paper having a structure in which kraft paper is stacked on the top and bottom surfaces of polypropylene resin.

In addition, the insulating layer 14 may be formed of only the composite insulating paper 140, and one or both of a surface of the insulating layer 14 which is in contact with the inner semiconducting layer 12 and a surface thereof which is in contact with the outer semiconducting layer 16 may be formed of the kraft paper 142. Both of the surfaces of the insulating layer 14 which are in contact with the inner semiconducting layer 12 and the outer semiconducting layer 16 may be formed by winding the kraft paper 142.

Unless the outside of the insulating layer 14 as well as the inside thereof is not shielded, a portion of an electric field is absorbed into the insulating layer 14 but the remaining electric field is discharged to the outside. In this case, when the electric field increases to a predetermined level or more, the insulating layer 14 and an outer cover of the cable 100 may be broken by the electric field. Thus, a semiconducting layer is provided at an outer side of the insulating layer 14. This semiconductor layer will be defined as the outer semiconducting layer 16 so that it may be distinguished from the inner semiconducting layer 12 described above.

The outer semiconducting layer 16 protects the insulating layer 14 by suppressing non-uniform electric fields caused by insulation thickness variations, and improves the dielectric strength of the insulating layer 14 by causing an electric force line distribution between the outer semiconducting layer 16 and the inner semiconducting layer 12 to have an equipotential level. Furthermore, the outer semiconducting layer 16 may planarize a surface of the insulating layer 14 to mitigate the concentration of an electric field in the cable 100, thereby preventing a corona discharge from occurring.

A woven copper wire tape 18 is provided at an outer side of the outer semiconducting layer 16. Furthermore, a metal sheath 220 formed of lead, i.e., a so-called lead sheath, is provided at an outer side of the woven copper wire tape 218 to prevent the insulation performance of either the insulating oil impregnated in the insulating layer 14 or an insulating compound from being degraded when a foreign substance such as water from the outside penetrates the cable 100.

A bedding layer 22 is provided at an outer side of the metal sheath 20 so that the metal sheath 20 may not be in direct contact with water. A non-woven fabric tape 24 and a proofed tape 26 are formed on the bedding layer 22 to cover the bedding layer 22. A jacket 32 is provided as an exterior of the cable 100 at an outer side of the cable 100. The jacket 32 is provided at the outer side of the cable 100 to protect the inner elements of the cable 100. The jacket 32 may be formed of, for example, polyethylene (PE) to have weather resistance to various environmental conditions and high mechanical strength.

A termination connection box is used to connect the cable 100 having the above structure to an aerial wire as described above.

Figure 2:
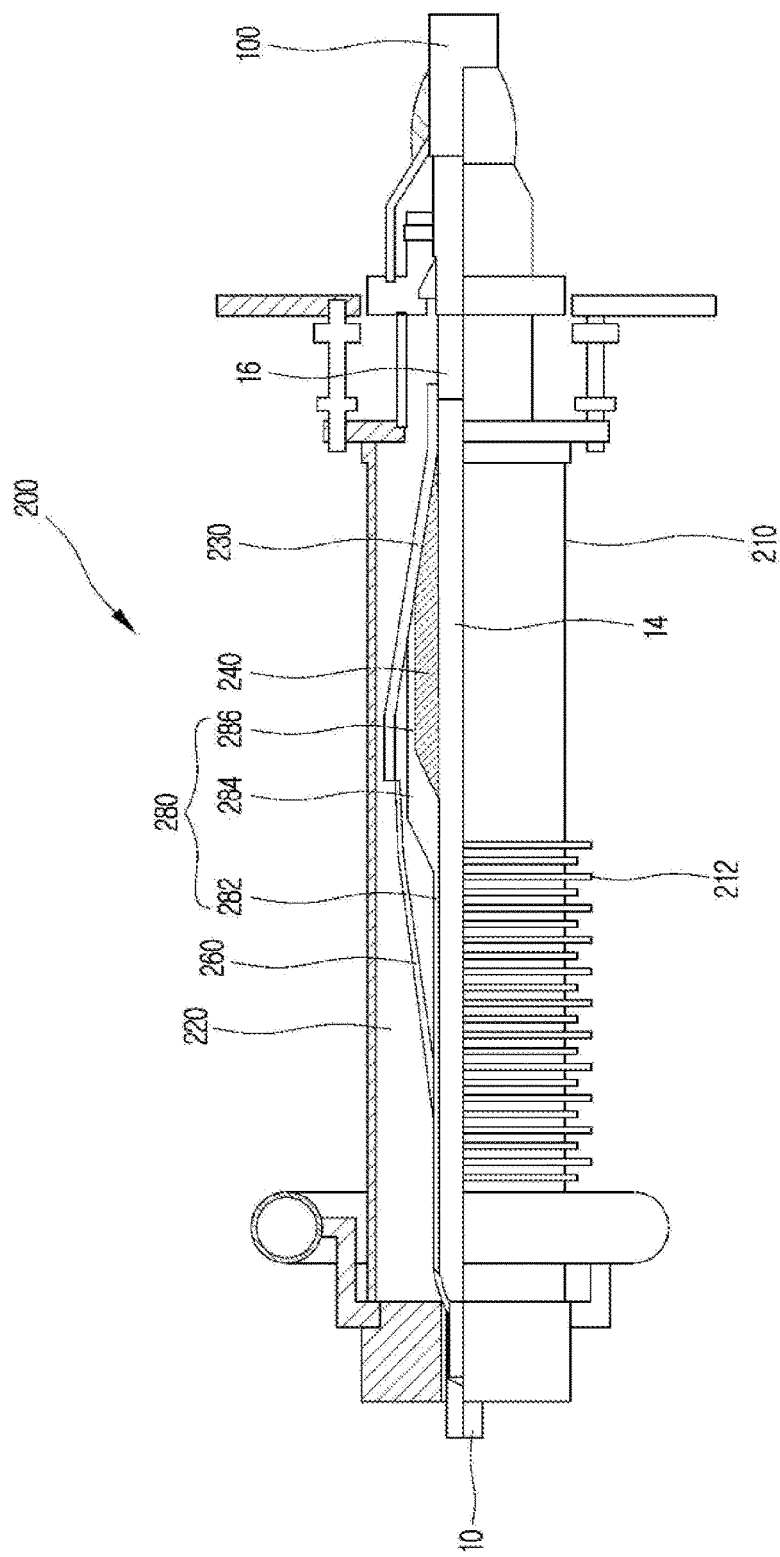
FIG. 2 is a cross-sectional view of a termination connection box according to an embodiment of the present invention.

FIG. 2 is a cross-sectional view of a termination connection box 200 for a paper insulation power cable 100 with a termination connection box (hereinafter referred to as the cable 100) according to an embodiment of the present invention. FIG. 2 is a partially exploded view of an inner structure of the termination connection box 200.

Referring to FIG. 2, the termination connection box 200 includes a porcelain tube 210. The porcelain tube 210 includes a space therein, into which one end portion of the cable 100 from which portions of an outer semiconducting layer 16, an insulating layer 14, and an inner semiconducting layer 212 are sequentially removed is inserted by a predetermined length to pass through the porcelain tube 210, as will be described in detail below. The porcelain tube 210 insulates and supports the cable 100. Thus, the porcelain tube 210 includes a plurality of wrinkles/protrusions 212 thereon to have an electrically sufficient dielectric strength. The plurality of wrinkles/protrusions 212 may increase an insulation distance of the porcelain tube 210, and prevent the dielectric strength of the porcelain tube 210 from being lowered when dust or the like is attached to a surface of the porcelain tube 210. The porcelain tube 210 is formed of hard ceramics so that it may have not only dielectric strength but also an appropriate level of hardness.

In the cable 100, a conductor 10 is pushed out by a predetermined length from an end portion of the porcelain tube 210 while passing through the porcelain tube 210. That is, elements covering the conductor 10 of the cable 100 are taken off within the porcelain tube 210, and only the conductor 10 is exposed and protrude from the end portion of the porcelain tube 210 and is connected to an aerial wire (not shown). The inside of the porcelain tube 210 is filled with insulating oil 220. The insulating oil 220 flows between the cable 100 and inner walls of the porcelain tube 210 within the porcelain tube 210, thereby electrically insulating the cable 100.

As described above, since the inner semiconducting layer 12 and the outer semiconducting layer 16 of the cable 100 may make a line of equipotential electric force distributed uniformly therebetween, an insulator may be prevented from being broken and an electric field may be prevented from being concentrated at a specific position. That is, it is preferable that an equipotential line of an electric force line between the inner semiconducting layer 12 and the outer semiconducting layer 16 be disposed as uniform as possible to be approximately parallel to the inner semiconducting layer 12 and the outer semiconducting layer 16. When the cable 100 is inserted into the porcelain tube 210 of the termination connection box 200, the cable 100 is inserted into the porcelain tube 210 in a state in which a portion of the outer semiconducting layer 16 is removed and thus the insulating layer 14 is exposed. In this case, the remaining outer semiconducting layer 16 is inserted by a predetermined length into the porcelain tube 210. That is, the cable 100 is inserted into the porcelain tube 210 while the insulating layer 14 is exposed, and the outer semiconducting layer 16 is inserted by the predetermined length into the porcelain tube 210.

If the cable 100 from which the outer semiconducting layer 16 is partially removed to expose the insulating layer 14 is inserted into the porcelain tube 210, an electric field may be concentrated on an end portion of the outer semiconducting layer 16 when a line of electric force is discharged between the outer semiconducting layer 16 and the inner semiconducting layer 12. In this case, the outer semiconducting layer 16 and the insulating layer 14 may be broken. Thus, as illustrated in FIG. 2, an electric-field mitigation cone 260 which mitigates the concentration of an electric field in the cable 100 and a shielding layer 230 may be provided in the porcelain tube 210.

Here, the shielding layer 230 is electrically connected to an end portion of the outer semiconducting layer 16 of the cable 100, and extends by a predetermined length while gently tilting in a direction of the end portion of the termination connection box 200 from which the conductor 10 is pushed out. In more detail, the shielding layer 230 may extend to an outside of a reinforcing insulating layer 240 and at least a portion of an outer side of the electric-field mitigation cone 260. That is, although the cable 100 is inserted into the porcelain tube 210 in a state in which the insulating layer 14 is exposed, the outer semiconducting layer 16 is inserted by the predetermined length into the porcelain tube 210. In this case, the shielding layer 230 is electrically connected to the outer semiconducting layer 16 inserted into the porcelain tube 210. This is because when the shielding layer 230 is electrically connected to the outer semiconducting layer 16, an electric field may be prevented from being concentrated on an end portion of the outer semiconducting layer 16. Furthermore, the shielding layer 230 electrically connected to the outer semiconducting layer 16 is formed to extend on the end portion of the outer semiconducting layer 16 while tilting at a predetermined angle with respect to an outer surface of the outer semiconducting layer 16 exposed in the direction of the end portion of the termination connection box 200 from which the conductor 10 is pushed out, thereby preventing an equipotential line from sharply bending between the inner semiconducting layer and the shielding layer 230. The equipotential line heads between the inner semiconducting layer 12 and the shielding layer 230 and along the inner semiconducting layer 12 and the shielding layer 230. Furthermore, the shielding layer 230 may cause the position of a triple point vulnerable to insulation (which is formed when an end portion of the outer semiconducting layer 16 of the cable 100 is in contact with the insulating layer 14 formed of a different material from that of the outer semiconducting layer 15 and the insulating oil 220 filled in the porcelain tube 210) from the insulating layer 14 which has relatively high temperature to a relatively low-temperature location according to a temperature change caused by electric current flowing through the conductor 10 when the cable 100 is operated, thereby stabilizing the insulation performance of the cable 100.

The electric-field mitigation cone 260 may be manufactured by winding insulating paper around a surface of a core 280. In this case, the core 280 has an internal diameter roughly matching a core of the cable 100, i.e., an outer circumference of the cable 100 on which the insulating layer 14 remains. Thus, the core 280 and the electric-field mitigation cone 260 are formed by passing the cable 100 through the inside of the core 280. In detail, the electric-field mitigation cone 260 is manufactured by winding the insulating paper around a surface of the core 280 and then impregnating the insulating paper again with insulating oil. The weight of the electric-field mitigation cone 260 manufactured as described above increases as the insulating paper is impregnated again with the insulating oil. In general, the termination connection box 200 is installed vertically. Thus, a structure which supports the electric-field mitigation cone 260 and the core 280 may be needed. To this end, a termination connection box according to the related art includes an additional support means to support a condenser cone. Thus, the termination connection box according to the related art is complicated in structure, and a sufficient work space is difficult to secure in a shielding process of connecting a cable and the bottom of the termination connection box, thereby increasing manufacturing time and costs. Thus, according to the present embodiment, the reinforcing insulating layer 240 is provided at an outer side of the cable 100 to support the electric-field mitigation cone 260 without using an additional support means for supporting the electric-field mitigation cone 260.

The reinforcing insulating layer 240 is provided at the outer side of the insulating layer 14 of the cable 100 from which the outer semiconducting layer 16 is removed, and supports the electric-field mitigation cone 260 while serving as an insulator. That is, the reinforcing insulating layer 240 not only supports the electric-field mitigation cone 260 but also improves the insulation performance of the cable 100, since it is formed by winding insulating paper or the like around the outer side of the insulating layer 14 of the cable 100. For example, the reinforcing insulating layer 240 may be provided to cover the outer side of the insulating layer 14 of the cable 100 (from which a portion of the outer semiconducting layer 16 is removed and at which an electric field is thus concentrated) to reinforce the dielectric strength of the outer side of the insulating layer 14. Thus, the intensity of an electric field in a region of the cable 100 having the reinforcing insulating layer 240 is lower than that of an electric field in the other regions thereof.

In this case, as illustrated in FIG. 2, the reinforcing insulating layer 240 may include an upper inclined portion having a predetermined slope toward an upper portion of the termination connection box 200, i.e., the end portion of the termination connection box 200 from which the conductor 10 is pushed out. The electric-field mitigation cone 260, and more particularly, the core 280 may be also formed to correspond to the upper inclined portion of the reinforcing insulating layer 24. When the core 280 is formed to correspond to the upper inclined portion of the reinforcing insulating layer 240, the core 280 should be formed to have the predetermined slope and may thus have a shape of a so-called 'two-tier core' as illustrated in FIG. 2.

That is, the core 280 may include a first base portion 282 provided on an outer circumference of the insulating layer 14 of the cable 100, a second base portion 286 which is closely contact with an outer circumference of the reinforcing insulating layer 240, and an inclined portion 284 connecting the first base portion 282 and the second base portion 286 to each other. The inclined portion 284 is formed to correspond to the upper inclined portion of the reinforcing insulating layer 240 such that when a core of the cable 100 is inserted into the electric-field mitigation cone 260 and the core 280, the electric-field mitigation cone 260 and the core 280 are supported by being stopped by the upper inclined portion of the reinforcing insulating layer 240 as illustrated in FIG. 2. In this case, the thickness of the reinforcing insulating layer 240 is determined such that the whole insulation performance of the cable 100 is improved and the weight of the electric-field mitigation cone 260 is supported by the reinforcing insulating layer 240. For example, the thickness of the reinforcing insulating layer 240 may be determined such that the reinforcing insulating layer 240 has an external diameter which is 1.5 to 2.5 times (preferably, 2 times) than that of the cable 100 in which the insulating layer 14 is exposed. In this case, the intensity of an electric field in the region of the cable 100 having the reinforcing insulating layer 240 is about half that of an electric field in the other regions thereof.

The electric-field mitigation cone 260 manufactured using the two-tier core is applicable to a termination connection box for a cable in which an insulating layer is formed of cross-linked polyethylene (XLPE), as well as those for the MI cable and the OF cable.

The reinforcing insulating layer 240 may further include a lower inclined portion having a predetermined slope toward the bottom of the termination connection box 200, i.e., a direction in which the cable 100 is inserted into the termination connection box 200. The shielding layer 230 electrically connected to the outer semiconducting layer 16 of the cable 100 may be formed to extend along the lower inclined portion of the reinforcing insulating layer 240 while tilting at a predetermined angle with respect to an outer surface of the insulating layer 14. Thus, an electric field may be prevented from being concentrated on the end portion of the outer semiconducting layer 16 of the cable 100, and the insulation performance at a triple point vulnerable to insulation may be reinforced by changing the position of the triple point.

However, the insulating layer 14 is exposed in the cable 100 from which the portion of the outer semiconducting layer 16 is removed. That is, the reinforcing insulating layer 240 of the termination connection box 200 is in contact with the insulating layer 14 of the cable 100. In this case, when the reinforcing insulating layer 240 in contact with the cable 100 and the insulating layer 14 of the cable 100 are formed of different materials, a heterojunction interface is formed between the reinforcing insulating layer 240 and the insulating layer 14. Thus, when an electric field is applied to the cable 100 for a predetermined time or more, electric charges may be accumulated between the reinforcing insulating layer 240 and the insulating layer 14 formed of different materials, i.e., at the heterojunction interface therebetween, thereby causing the electric field to be locally concentrated.

For example, the materials of the insulating layer 14 described above, i.e., the kraft paper 142 and the composite insulating paper 140 will be compared with each other. The dielectric strength of the composite insulating paper 140 is about 1.6 times higher than that of the kraft paper 140. Thus, the reinforcing insulating layer 240 of the termination connection box 200 may be formed by winding the composite insulating paper 140. However, if the insulating layer 14 on the outer side of the inner semiconducting layer 12 includes a structure in which the kraft paper 142, the composite insulating paper 140, and the kraft paper 142 are sequentially stacked, a heterojunction interface is formed between the kraft paper 142 and the composite insulating paper 140 when the reinforcing insulating layer 240 is formed of the composite insulating paper 140, since an outermost layer of the insulating layer 14 includes the kraft paper 142 and the reinforcing insulating layer 240 includes the composite insulating paper 140. Accordingly, space charges are accumulated at the heterojunction interface and an electric field is thus concentrated thereon, thereby exercising a bad effect on the insulation performance of the entire termination connection box 200.

Furthermore, when the reinforcing insulating layer 240 is formed of the composite insulating paper 140, an electric field is dispersed to the composite insulating paper 140 of the reinforcing insulating layer 240 according to resistive electric field distribution of a DC cable in which an electric field is distributed according to resistivity. Thus, the reinforcing insulating layer 240 should be formed to a thick thickness so that a voltage of the outermost layer of the reinforcing insulating layer 240 having thereon the shielding layer 230 electrically connected to the outer semiconducting layer 16 of a ground voltage of the cable 100 may be maintained at the ground voltage. Thus, the size of the termination connection box 200 increases and manufacturing costs thereof increases.

Thus, in order to solve the above problem, when the cable 100 is coupled to the termination connection box 200, the reinforcing insulating layer 240 of the termination connection box 200 may be formed of the same material as the outermost layer of the insulating layer 14 of the cable 100. For example, when the insulating layer 14 of the cable 100 includes a stacked structure of the kraft paper 142, the composite insulating paper 140, and the kraft paper 142 as in the embodiment described above, the reinforcing insulating layer 240 of the termination connection box 200 may be formed of the same material, i.e., kraft paper, as the outermost layer of the insulating layer 14 of the cable 100 as illustrated in FIG. 3. The dielectric strength of the kraft paper is 35 to 40% less than that of the composite insulating paper 142 but a heterojunction interface is not formed between the kraft paper and the insulating layer 14 of the cable 100, thereby preventing accumulation of space charges.

When the insulation performance of the whole termination connection box 200 is taken into account, the termination connection box 200 exhibits high insulation performance in view of insulation cooperation when the reinforcing insulating layer 240 is formed of kraft paper than when the reinforcing insulating layer 240 is formed of composite insulating paper. The inventor of the present application formed one reinforcing insulating layer of kraft paper and another reinforcing insulating layer of composite insulating paper when the insulating layer 14 of the cable 100 was formed by sequentially forming the kraft paper 142, the composite insulating paper 140, and the kraft paper 142, and then compared the insulating performances of the reinforcing insulating layers with each other through an electric field analysis.

TABLE 1

| | Temperature (° C.) | Insulating layer of cable | | | | | |
|---|---|---|---|---|---|---|---|
| | | External diameter of conductor | External diameter of inner kraft paper | Internal diameter of composite insulating paper | External diameter of composite insulating paper | Internal diameter of outer kraft paper | External diameter of outer kraft paper |
| Kraft paper | 20 | 4.87 | 4.60 | 46.66 | 37.30 | 3.08 | 3.00 |
| | 80 | 3.78 | 4.16 | 30.00 | 50.07 | 7.88 | 9.16 |
| Compound insulating paper | 20 | 4.87 | 4.59 | 46.69 | 37.26 | 3.07 | 2.87 |
| | 80 | 1.62 | 2.09 | 19.45 | 61.47 | 10.13 | 12.64 |

(Unit: kV/mm)

Table 1 above shows a result of forming one reinforcing layer of the kraft paper and another reinforcing layer of the composite insulating paper and then analyzing an electric field in a cable. Referring to Table 1 above, if the temperature of the cable was about 20° C., an electric field in the cable when the reinforcing insulating layer was formed of the kraft paper and an electric field in the cable when the reinforcing insulating layer was formed of the composite insulating paper were roughly the same. If the temperature of the cable was about 80° C., an electric field was measured to be relatively low at an external diameter of a conductor of the cable, an external diameter of the kraft paper 142 which is inner kraft paper, and an internal diameter of the composite insulating paper 140, when the reinforcing insulating layer was formed of the composite insulating paper 140. However, when an electric field was measured at the outside of an insulating layer adjacent to a so-called triple point which is substantially vulnerable to insulation (i.e., the external diameter of the composite insulating paper 140, and internal and internal diameters of the kraft paper 142 which is outer kraft paper), the electric field when the reinforcing insulating layer was formed of the kraft paper 142 was lower by about 70% than that when the reinforcing insulating layer was formed of the composite insulating paper 140.

TABLE 2

| | Temperature (° C.) | Electric field (kV/mm) at interface between external diameter of insulating layer of cable and reinforcing insulating layer |
|---|---|---|
| Kraft paper | 20 | 0.11 |
| | 80 | 0.35 |
| Composite insulating paper | 20 | 1.63 |
| | 80 | 2.27 |

Table 2 above shows a result of measuring an electric field at an interface between an external diameter of the insulating layer of the cable and a reinforcing insulating layer formed of kraft paper, and an electric field at an interface between the external diameter of the insulating layer of the cable and a reinforcing insulating layer formed of composite insulating paper. Referring to Table 2 above, if the temperature of the cable was about 20° C., the electric field at the interface between the insulating layer of the cable and the reinforcing insulating layer when the reinforcing insulating layer was formed of the kraft paper was about 6.7% lower than that when the reinforcing insulating layer was formed of the composite insulating paper. If the temperature of the cable 100 was about 80° C. (OK?), the electric field at the interface between the insulating layer of the cable and the reinforcing insulating layer when the reinforcing insulating layer was formed of the kraft paper was about 15.4% lower than that when the reinforcing insulating layer was formed of the composite insulating paper.

TABLE 3

| | Temperature (° C.) | First tier | Second tier | Third tier | Fourth tier |
|---|---|---|---|---|---|
| Kraft paper | 20 | 0.05 | 0.059 | 0.070 | 0.081 |
| | 80 | 0.175 | 0.195 | 0.250 | 0.304 |
| Composite insulating paper | 20 | 0.815 | 0.593 | 0.556 | 0.553 |
| | 80 | 1.136 | 0.911 | 0.910 | 0.950 |

(Unit: kV/mm)

Table 3 above shows a result of measuring an electric field in a diagonal direction along an outer side of a shielding layer of a termination connection box when the reinforcing insulating layer was formed of kraft paper, and measuring an electric field in the diagonal direction along the outer side of the shielding layer of the termination connection box when the reinforcing insulating layer was formed of composite insulating paper, and comparing the measured electric fields with each other. Referring to Table 3 above, if the temperature of the cable was about 20° C., the electric field measured when the reinforcing insulating layer was formed of the kraft paper was about 6% to 15% lower than that when the reinforcing insulating layer was formed of the composite insulating paper. Similarly, if the temperature of the cable was about 80° C., the electric field measured when the reinforcing insulating layer was formed of the kraft paper was about 15% to 32% lower than that when the reinforcing insulating layer was formed of the composite insulating paper.

In conclusion, the insulating performance of the whole termination connection box when the reinforcing insulating layer was formed of the kraft paper was higher than that when the reinforcing insulating layer was formed of the composite insulating paper, in view of insulation cooperation.

In the related art, a termination connection box for a cable including an insulating layer formed of XLPE, as well as those for the OF cable and the MI cable, an insulating layer is formed using kraft paper when an electric-field mitigation cone is manufactured. That is, the electric-field mitigation cone is formed by winding the kraft paper around a core, and a core of a cable is inserted into the core to pass through the core.

However, the dielectric strength of the kraft paper is 35 to 40% lower than that of the composite insulating paper as described above. Thus, when the electric-field mitigation cone is formed of the kraft paper, the size of the electric-field mitigation cone should be increased to secure a desired level of insulating performance, thereby increasing the whole volume of the termination connection box. If the termination connection box is manufactured in a large size, it takes a large amount of time and high costs to carry it. Furthermore, when a work of coupling the termination connection box to a cable and the like are taken into account, a time and costs for assembling the termination connection box and the cable together remarkably increase. Thus, the termination connection box should be manufactured in a small size. To this end, it is important to reduce the electric-field mitigation cone and the other elements of the termination connection box in size.

To solve this problem, in the present embodiment, an electric-field mitigation cone is manufactured using composite insulating paper. The dielectric strength of the composite insulating paper is 1.6 times higher than that of kraft paper. Thus, when the electric-field mitigation cone is formed of the composite insulating paper, a desired level of dielectric strength may be secured while reducing the electric-field mitigation cone to a smaller size than when the electric-field mitigation cone is formed of the kraft paper, thereby manufacturing the termination connection box in a smaller size. The electric-field mitigation cone manufacture using the composite insulating paper is applicable to a termination connection box for a cable including an insulating layer formed of XLPE, as well as those for the MI cable and the OF cable.

According to one or more of the above embodiments of the present invention, the occurrence of a heterojunction interface between a power cable and a termination connection box (OK?) may be reduced to prevent accumulation of space charges and mitigate an electric field.

Also, according to one or more of the above embodiments of the present invention, a termination connection box may be reduced in size and may be thus easily coupled to a power cable.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A power cable with a termination connection box, the power cable comprising a conductor, an inner semiconducting layer, an insulating layer, and an outer semiconducting layer which are sequentially formed,
   wherein the insulating layer comprises composite insulating paper, wherein surfaces of the insulating layer which are in contact with the inner semiconducting layer and the outer semiconducting layer are wound with insulating paper including only kraft paper, and the composite insulating paper has a structure in which the kraft paper is stacked on top and bottom surfaces of thermoplastic resin, and
   wherein the termination connection box comprises:
   a porcelain tube configured to provide an inner space into which an end portion of the power cable from which portions of the outer semiconducting layer, the insulating layer, and the inner semiconducting layer are sequentially removed is inserted; and
   a reinforcing insulating layer configured to cover an outer side of the insulating layer of the power cable so as to reinforce dielectric strength of a portion of the power cable from which the portion of the outer semiconducting layer is removed and at which an electric field is thus concentrated,
   wherein the reinforcing insulating layer comprises the same insulating paper as an outermost layer of the insulating layer of the power cable.

2. The power cable of claim 1, wherein the reinforcing insulating layer comprises the kraft paper.

3. The power cable of claim 2, an electric-field mitigation cone configured to mitigate concentration of an electric field, and a shielding layer are provided in the porcelain tube.

4. The power cable of claim 3, wherein the reinforcing insulating layer supports the electric-field mitigation cone.

5. The power cable of claim 4, wherein the reinforcing insulating layer comprises an upper inclined portion having a predetermined slope toward an end portion of the termination connection box from which the conductor is pushed out, wherein the upper inclined portion corresponds to an upper portion of the termination connection box.

6. The power cable of claim 5, wherein the termination connection box further comprises a core provided on the exposed insulating layer of the power cable and corresponding to the upper inclined portion of the reinforcing insulating layer,
   wherein the electric-field mitigation cone is formed by winding a plurality of pieces of insulating paper around the core.

7. The power cable of claim 6, wherein the core comprises:
   a first base portion provided on an outer circumference of the insulating layer of the power cable;
   a second base portion which is in closely contact with an outer circumference of the reinforcing insulating layer; and
   an inclined portion connecting the first base portion and the second base portion to each other,
   wherein the inclined portion corresponds to the upper inclined portion of the reinforcing insulating layer.

8. The power cable of claim 6, wherein the plurality of pieces of insulating paper of the electric-field mitigation cone comprise a structure in which kraft paper is stacked on top and bottom surfaces of thermoplastic resin.

9. The power cable of claim 3, wherein the shielding layer is electrically connected to the outer semiconducting layer of the power cable inserted into the porcelain tube.

10. The power cable of claim 3, wherein the reinforcing insulating layer comprises a lower inclined portion having a predetermined slope in a direction in which the power cable is inserted, wherein the lower inclined portion corresponds to a lower portion of the termination connection box.

11. The power cable of claim 10, wherein the shielding layer is provided along the lower inclined portion of the reinforcing insulating layer, such that the shielding layer tilts at a predetermined angle with respect to an outer surface of the insulating layer of the power cable exposed in a direction of the end portion of the termination connection box from which the conductor is pushed out and extends to the reinforcing insulating layer and at least a portion of the electric-field mitigation cone.

* * * * *